United States Patent
Wang et al.

(10) Patent No.: US 7,131,081 B2
(45) Date of Patent: Oct. 31, 2006

(54) SCALABLE SCAN-PATH TEST POINT INSERTION TECHNIQUE

(75) Inventors: Seongmoon Wang, Plainsboro, NJ (US); Srimat Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 368 days.

(21) Appl. No.: 10/736,879

(22) Filed: Dec. 16, 2003

(65) Prior Publication Data

US 2004/0177299 A1    Sep. 9, 2004

Related U.S. Application Data

(60) Provisional application No. 60/447,272, filed on Feb. 14, 2003.

(51) Int. Cl.
  *G06F 17/50* (2006.01)
(52) U.S. Cl. .............................. 716/4; 716/6
(58) Field of Classification Search ................... 716/1, 716/4, 6
See application file for complete search history.

(56) References Cited

U.S. PATENT DOCUMENTS 5,642,362 A    6/1997    Savir
6,148,425 A *  11/2000   Bhawmik et al. ........... 714/726

OTHER PUBLICATIONS

D. Belete, A. Razdan, W. Schwarz, R. Raina, C. Hawkins, and J. Morehead. Use of DFT Techniques in Speed Grading a 1GHz+ Microprocessor. In Proceedings IEEE International Test Conference, pp. 1111-1119, 2002.

K.-T. Cheng, S. Devadas, and K. Keutzer. A Partial Enhanced-Scan Approach to Robust Delay-Generation for Sequential Circuits}. In Proceedings IEEE International Test Conference, pp. 403-410, 1991.

V. Dabholker, S. Chakravarly, I. Pomeranz, and S. Reddy. Techniques for Minimizing Power Dissipation in Scan and Combinational Circuits During Test Application. In IEEE Trans. on Computer-Aided Design of Integrated Circuit and System, vol. 17(12), Dec. 1998.

B. Dervisoglu and G. Stong. Design for Testability: Using Scanpath Techniques for Path-Delay Test and Measurement. In Proceedings IEEE International Test Conference, pp. 365-374, 1991.

S. Gerslendorfer and H.-J. Wunderlich. Minimized Power Consumption for Scan-Based BIST. In Proceedings IEEE International Test Conference, pp. 77-84, 1999.

M. J, Geuzebroek, J. T. van der Linden, and A. J. van de Goor. Test Point Insertion for Compact Test Sets). In Proceedings IEEE International Test Conference, pp. 292-301, 2000.

P. Goel. An Implicit Enumeration Algorithm to Generate Tests for Combinational Logic Circuits}. In IEEE Trans. on Computers, vol. C-30(3), Mar. 1981.

L. H. Goldstein and E. L. Thigpen. SCOAP: Sandia Controllability/Observability Analysis Program. In Proceedings IEEE-ACM Design Automation Conference, pp. 190-196, 1980.

(Continued)

*Primary Examiner*—Thuan Do

(57) ABSTRACT

A logic circuit comprising at least one input, one output and a delay fault circuit. The delay fault circuit includes a first standard scan cell, a combinational test point positioned immediately after the first standard scan cell in a scan chain and a second standard scan cell positioned immediately after the combinational test point in the scan chain.

38 Claims, 8 Drawing Sheets

OTHER PUBLICATIONS

W. Mao and M. D. Ciletti. Reducing Correlation to Improve Coverage of Delay Faults in Scan-Path Design}. In IEEE Trans. on Computer-Aided Design of Integrated Circuit and System, vol. 13(5), May. 1994.

I. Pomeranz and S. M. Reddy. On Achieving Complete Converage of Delay Faults In Full Scan Circuits using Locally Available Lines. In Proceedings IEEE International Test Conference, pp. 923-931, 1999.

J. Savir and R. Berry, At-Speed Test is not Necessarily an AC Test. In Proceedings IEEE International Test Conference, pp. 722-728, 1991.

J. Savir and S. Patil. Scan-Based Transition Test. In IEEE Trans. on Computer-Aided Design of Integrated Circuit and System, vol. 12(8), Aug. 1993.

J. Savir and S. Patil. Broad-Side Delay Test. In Transactions on Computer-Aided Design of Intergrated Circuit and System, vol. 13(8), Aug. 1994.

J. Saxena, K. M. Butler, J. Gatt, R. R. S. P. Kumar, S. Basu, D. J. Campbell, and J. Berech. Scan-Based Transition Fault Testing—Implementation and Low Cost Test Challenges. In Proceedings IEEE International Test Conference, pp. 1120-1129, 2002.

G. L. Smith. Model for Delay Faults Based Upon Paths. In Proceedings IEEE International Test Conference, pp. 342-349, 1985.

N. Tamarapalli and J. Rajski. Constructive Multi-Phase Test Point Insertion for Scan-Based BIST. In Proceedings IEEE International Test Conference, pp. 649-658, 1996.

J. A. Waicukauski, E. Lindbloom, B. K. Rosen, and V. S. Iyengar. Transition Fault Simulation. In IEEE Design & Test of Computers, pp. 32-38, Apr. 1987.

S. Wang and S. K. Gupta. DS-LFSR: A BIST TPG for Low Switching Activity. In IEEE Trans. onComputer-Aided Design of Integrated Circuit and System, vol. 21(7), Jul. 2002.

IEEE standard 1149.1-2001. IEEE Standard Test Access Port and Boundary-Scan Architecture. IEEEE standard board, New York, N.Y., pp. 1-119, 1990.

* cited by examiner $E_O$  $d_i \in \{11, 01\}$
(a)

$E_A$  $d_i \in \{00, 10\}$
(b)

$d_i \in \{00, 01, 10, 11\}$
(c)

$d_i \in \{00, 01, 10, 11\}$
(d)

| set | TP vector | $S_1$ | $S_2$ | $S_3$ | $S_4$ | $S_5$ | $S_6$ | $S_7$ |
|---|---|---|---|---|---|---|---|---|
| $C^1$ | Initial $TP^1$ | W | R | W | R | W | W | R |
| | $V^1_1$ | 0 | X | X | 0 | 1 | X | X |
| | $V^1_2$ | 0 | 1 | X | 0 | 0 | 1 | 0 |
| | updated $TP^1$ | W | O | W | Wo | W | W | Wo |
| | $V^2_1$ | 1 | 1 | 1 | 0 | 1 | 0 | X |
| | $V^2_2$ | 1 | 1 | 1 | 0 | 0 | 1 | 0 |
| | updated $TP^1$ | W | O | W | A | W | W | Wo |
| | final $TP^1$ | W | O | W | A | W | W | W |
| | GlobalTP vector | W | O | W | A | W | W | W |
| $C^2$ | initial $TP^2$ | W | R | W | R | W | W | R |
| | $V^3_1$ | X | 1 | 1 | 1 | X | 1 | X |
| | $V^3_2$ | 1 | 0 | 1 | 0 | 1 | X | 1 |
| | updated $TP^2$ | W | Wo | W | A | W | W | W1 |
| | $V^4_1$ | 1 | 1 | X | 1 | X | 0 | X |
| | $V^4_2$ | 1 | 0 | 1 | X | 1 | X | 1 |
| | updated $TP^2$ | W | A | W | A | W | W | O |
| | final $TP^2$ | W | A | W | A | W | W | O |
| | GlobalTP vector | W | AO | W | A | W | W | O |

Figure 5

|     | $s_1$ | $s_2$ | $s_3$ | $s_4$ | $s_5$ | $s_6$ | $s_7$ | test point enable signals | | | |
| --- | --- | --- | --- | --- | --- | --- | --- | --- | --- | --- | --- |
| GTP | R | AO | W | A | W | W | O | $E_{2,A}$ | $E_{2,O}$ | $E_{4,A}$ | $E_{7,O}$ |
| $TP^1$ | W | O | W | A | W | W | W | X | 1 | 1 | 0 |
| $TP^2$ | W | A | W | A | W | W | O | 1 | 0 | 1 | 1 |

Figure 6

Table 1: Experimental Results

| CKT Name | # FFs | Default Scan Chain Order | | | | | | | | | | Optimal Scan Chain Order | | | | | | | | | | |
|---|---|---|---|---|---|---|---|---|---|---|---|---|---|---|---|---|---|---|---|---|---|---|
| | | [12] | Proposed | | | | | | | | | [12] | Proposed | | | | | | | | | |
| | | # dep. flts | # dep. FFs | A,O,AO | | | | | A,O,DFF | | | # dep. flts | # dep. FFs | A,O,AO | | | | | A,O,DFF | | | |
| | | | | TL % | HO % | # TP | # CE | time sec. | TL % | HO % | # TP | # CE | | | TL % | HO % | # TP | # CE | time sec. | TL % | HO % | # TP | # CE |
| s208 | 8 | 15 | 7 | 44 | 75 | 7 | 1 | 0.1 | 44 | 75 | 7 (0) | 1 | 17 | 7 | 44 | 75 | 7 | 2 | 0.2 | 44 | 75 | 7 (0) | 1 |
| s298 | 14 | 16 | 7 | 32 | 82 | 3 | 4 | 0.2 | 23 | 68 | 3 (2) | 1 | 10 | 5 | 25 | 80 | 3 | 2 | 0.1 | 18 | 70 | 3 (1) | 1 |
| s344 | 15 | 8 | 14 | 47 | 95 | 2 | 2 | 0.1 | 43 | 91 | 2 (1) | 1 | 5 | 11 | 41 | 93 | 2 | 2 | 0.1 | 13 | 89 | 2 (1) | 1 |
| s349 | 15 | 8 | 14 | 47 | 95 | 2 | 2 | 0.1 | 43 | 91 | 2 (1) | 1 | 5 | 11 | 41 | 93 | 2 | 2 | 0.1 | 13 | 89 | 2 (1) | 1 |
| s386 | 6 | 11 | 5 | 42 | 75 | 4 | 4 | 0.3 | 17 | 65 | 4 (1) | 1 | 17 | 5 | 42 | 70 | 4 | 3 | 0.3 | 25 | 50 | 4 (2) | 1 |
| s420 | 16 | 31 | 15 | 47 | 75 | 15 | 4 | 0.7 | 41 | 82 | 15(2) | 2 | 15 | 15 | 47 | 82 | 11 | 9 | 0.8 | 25 | 47 | 11(7) | 2 |
| s444 | 21 | 18 | 13 | 37 | 68 | 6 | 3 | 0.5 | 23 | 60 | 6 (5) | 1 | 5 | 4 | 15 | 88 | 1 | 1 | 0.2 | 9 | 75 | 1 (1) | 0 |
| s510 | 6 | 20 | 5 | 42 | 65 | 5 | 5 | 0.6 | 8 | 15 | 5 (4) | 1 | 25 | 5 | 42 | 55 | 5 | 5 | 0.8 | 8 | 15 | 5 (4) | 1 |
| s526 | 21 | 49 | 14 | 39 | 79 | 8 | 4 | 0.6 | 25 | 63 | 7 (5) | 1 | 9 | 5 | 19 | 85 | 3 | 3 | 0.3 | 11 | 75 | 2 (1) | 1 |
| s820 | 5 | 63 | 4 | 40 | 56 | 4 | 6 | 4.6 | 10 | 19 | 4 (3) | 1 | 63 | 4 | 40 | 56 | 4 | 6 | 4.6 | 10 | 19 | 4 (3) | 1 |
| s832 | 5 | 63 | 4 | 40 | 56 | 4 | 6 | 5.0 | 10 | 19 | 4 (3) | 1 | 63 | 4 | 40 | 56 | 4 | 6 | 5.0 | 10 | 19 | 4 (3) | 1 |
| s838 | 32 | 65 | 31 | 48 | 73 | 31 | 5 | 3.5 | 40 | 60 | 31(6) | 4 | 40 | 31 | 48 | 81 | 23 | 12 | 4.3 | 34 | 60 | 23(9) | 4 |
| s953 | 29 | 18 | 5 | 14 | 70 | 5 | 3 | 3.2 | 11 | 60 | 5 (1) | 2 | 0 | 0 | 0 | - | 0 | 0 | - | 0 | - | 0(0) | 0 |
| s1423 | 74 | 8 | 62 | 45 | 98 | 4 | 1 | 12 | 45 | 98 | 4 (0) | 1 | 0 | 58 | 44 | - | 0 | 0 | - | 44 | 100 | 0(0) | 0 |
| s1488 | 6 | 46 | 5 | 42 | 50 | 5 | 6 | 8 | 0 | 0 | 5 (5) | 0 | 48 | 5 | 42 | 50 | 5 | 7 | 9.9 | 0 | 0 | 5(5) | 0 |
| s1494 | 6 | 46 | 5 | 42 | 50 | 5 | 6 | 8 | 0 | 0 | 5 (5) | 0 | 48 | 5 | 42 | 50 | 5 | 8 | 10.2 | 0 | 0 | 5(5) | 0 |
| s5378 | 179 | 120 | 114 | 39 | 88 | 43 | 13 | 35 | 34 | 81 | 43(15) | 3 | 16 | 35 | 16 | 94 | 6 | 3 | 24.7 | 11 | 91 | 6(2) | 2 |
| s9234 | 228 | 231 | 178 | 44 | 90 | 53 | 12 | 211 | 38 | 82 | 54(25) | 3 | 42 | 72 | 24 | 92 | 19 | 3 | 146 | 17 | 92 | 9(1) | 3 |
| s13207 | 669 | 234 | 404 | 38 | 92 | 105 | 23 | 302 | 36 | 89 | 106(22) | 5 | 2 | 61 | 8 | 99 | 2 | 1 | 202 | 8 | 99 | 2(0) | 1 |
| s15850 | 597 | 428 | 406 | 40 | 91 | 120 | 29 | 1140 | 36 | 85 | 120(40) | 5 | 7 | 109 | 15 | 99 | 4 | 1 | 790 | 15 | 99 | 4(0) | 1 |
| s38417 | 1636 | 88 | 1038 | 39 | 99 | 30 | 4 | 2962 | 39 | 99 | 30 (6) | 3 | 73 | 75 | 4 | 99 | 1 | 1 | 2768 | 4 | 100 | 1(0) | 1 |
| s38584 | 1452 | 753 | 1296 | 47 | 95 | 221 | 16 | 3616 | 45 | 92 | 221(70) | 4 | 75 | 64 | 4 | 97 | 6 | 2 | 2911 | 4 | 96 | 6(1) | 1 |

Figure 8

SCALABLE SCAN-PATH TEST POINT INSERTION TECHNIQUE

I.A. RELATED APPLICATIONS

This Application claims priority from U.S. Provisional Application Ser. No. 60/447,272 filed Feb. 14, 2003, now abandoned, the contents of which are incorporated herein by reference.

I.B. FIELD

The present disclosure teaches techniques related to enhancing coverage of delay faults in scan designs for testing of circuits.

I.C. BACKGROUND

1. References

The following papers provide useful background information, for which they are incorporated herein by reference in their entirety, and are selectively referred to in the remainder of this disclosure by their accompanying reference numbers in square brackets (i.e., [3] for the third numbered paper by J. Monteiro and S. Devdas):

[1] D. Belete, A. Razdan, W. Schwarz, R. Raina, C. Hawkins, and J. Morehead. Use of DFT Techniques In Speed Grading a 1 GHz+ Microprocessor. In Proceedings IEEE International Test Conference, pages 1111–1119, 2002.

[2] K.-T. Cheng, S. Devadas, and K. Keutzer. A Partial Enhanced-Scan Approach to Robust Delay-Generation for Sequential Circuits}. In Proceedings IEEE International Test Conference, pages 403–410, 1991.

[3] V. Dabholkar, S. Chakravarty, I. Pomeranz, and S. Reddy. Techniques for Minimizing Power Dissipation in Scan and Combinational Circuits During Test Application. In IEEE Trans. on Computer-Aided Design of Integrated Circuit and System, Vol. 17(12), December 1998.

[4] B. Dervisoglu and G. Stong. Design for Testability: Using Scanpath Techniques for Path-Delay Test and Measurement. In Proceedings IEEE International Test Conference, pages 365–374, 1991.

[5] S. Gerstendorfer and H.-J. Wunderlich. Minimized Power Consumption for Scan-Based BIST. In Proceedings IEEE International Test Conference, pages 77–84, 1999.

[6] M. J. Geuzebroek, J. T. van der Linden, and A. J. van de Goor. Test Point Insertion for Compact Test Sets}. In Proceedings IEEE International Test Conference, pages 292–301, 2000.

[7] P. Goel. An Implicit Enumeration Algorithm to Generate Tests for Combinational Logic Circuits}. In IEEE Trans. on Computers, Vol. C-30(3), March 1981.

[8] L. H. Goldstein and E. L. Thigpen. SCOAP: Sandia Controllability/Observability Analysis Program. In Proceedings IEEE-ACM Design Automation Conference, pages 190–196, 1980.

[9] W. Mao and M. D. Ciletti. Reducing Correlation to Improve Coverage of Delay Faults in Scan-Path Design}. In IEEE Trans. on Computer-Aided Design of Integrated Circuit and System, Vol. 13(5), May 1994.

[10] I. Pomeranz and S. M. Reddy. On Achieving Complete Coverage of Delay Faults in Full Scan Circuits using Locally Available Lines. In Proceedings IEEE International Test Conference, pages 923–931, 1999.

[11] J. Savir and R. Berry. At-Speed Test is not Necessarily an AC Test. In Proceedings IEEE International Test Conference, pages 722–728, 1991.

[12] J. Savir and S. Patil. Scan-Based Transition Test. In IEEE Trans. on Computer-Aided Design of Integrated Circuit and System, Vol. 12(8), August 1993.

[13] J. Savir and S. Patil. Broad-Side Delay Test. In Transactions on Computer-Aided Design of Integrated Circuit and System, Vol. 13(8), August 1994.

[14] J. Saxena, K. M. Butler, J. Gatt, R. R, S. P. Kumar, S. Basu, D. J. Campbell, and J. Berech. Scan-Based Transition Fault Testing—Implementation and Low Cost Test Challenges. In Proceedings IEEE International Test Conference, pages 1120–1129, 2002.

[15] G. L. Smith. Model for Delay Faults Based Upon Paths. In Proceedings IEEE International Test Conference, pages 342–349, 1985.

[16] IEEE standard 1149.1-2001. IEEE Standard Test Access Port and Boundary-Scan Architecture. IEEEE standard board, New York, N.Y., 1990.

[17] N. Tamarapalli and J. Rajski. Constructive Multi-Phase Test Point Insertion for Scan-Based BIST. In Proceedings IEEE International Test Conference, pages 649–658, 1996.

[18] J. A. Waicukauski, E. Lindbloom, B. K. Rosen, and V. S. Iyengar. Transition Fault Simulation. In IEEE Design & Test of Computers, pages 32–38, April 1987.

[19] S. Wang and S. K. Gupta. DS-LFSR: A BIST TPG for Low Switching Activity. In IEEE Trans. on Computer-Aided Design of Integrated Circuit and System, Vol. 21(7), July 2002.

2. Related Work

Ascertaining correct operation of digital circuits at desired speed is becoming more important. Conventionally, at-speed testing was typically accomplished with functional test patterns. However, developing functional test patterns that attain satisfactory fault coverage is unacceptable for large scale designs due to the prohibitive development cost. Even if functional test patterns that can achieve high fault coverage are available, applying these test patterns at-speed for high speed chips requires very stringent timing accuracy, which can only be provided by very expensive automatic test equipments (ATEs).

The scan-based delay test approach where test patterns are generated by an automatic test pattern generator (ATPG) on designs that involve scan chains is increasingly used as a cost efficient alternative to the at-speed functional pattern approach to test large scale chips for performance-related failures [1, 14].

The transition delay fault model [18] is widely used in industry for its simplicity. Because of its similarity to the stuck-at fault model, ATPGs and fault simulators that are developed for stuck-at faults can be reused for transition delay faults with minor modifications. Unlike the path delay fault model [15] where the number of target faults is often exponential, the number of transition delay faults is linear to the number of circuit lines. This eliminates the need for critical path analysis and identification procedures, which are necessary for the path delay fault model.

Detection of a delay fault requires application of a two-pattern test; the first pattern that initializes the targeted faulty circuit line to a desired value and the second pattern that launches a transition at the circuit line and propagates the fault effect to one or more primary outputs or scan flip-flops. There are two different approaches to apply two-pattern tests in standard scan environment. In both approaches, the first pattern of a test pattern pair is scanned in through scan chains in the same fashion as a test pattern for a stuck-at fault is scanned in and the second pattern is derived from the first pattern.

In the first approach, referred to as skewed-load [12] or launch-by-shift, the second pattern is obtained by shifting in the first pattern by one more scan flip-flop. Hence, given a first pattern, there are only two possible patterns for the second pattern that differs only at the value for the first scan flip-flop whose scan input is connected to the scan chain input. This shift dependency restricts the number of combinations of test pattern pairs to $2^n \times 2$ [11] in standard scan environment, where n is the number of scan flip-flops in the scan chain.

In the second approach, referred to as broadside-load [12, 13] or launch-from-capture, the second pattern is obtained from the circuit response to the first pattern. Hence, the second pattern is given by the circuit response to the first pattern. Due to restriction to apply the second pattern in both approaches, transition delay fault coverage in standard scan environment is sometimes significantly lower than stuck-at fault coverage [12].

Several conventional techniques have been proposed to improve delay fault coverage in standard scan environment. In the techniques described in [6, 10], extra logic is inserted into the functional path to improve delay fault coverage in standard scan environment. A drawback of this method is performance degradation entailed due to additional logic that is inserted into the functional path. Enhanced scan testing [4] is a powerful scan technique that allows applying all possible $2^n \times (2^n-1)$ combinations of pattern pairs to the circuit. Such faults that are not testable under standard scan environment but testable under full enhanced scan environment are referred to herein as dependency untestable faults. Since this technique requires to replace all standard scan cells by enhanced scan cells, which can hold two bits, the drawback of enhanced scan testing is high area overhead of enhanced scan cells.

In order to reduce area overhead, partial enhanced scan technique where only selected scan flip-flops are replaced by enhanced scan flip-flops is proposed by [2]. As a similar approach to the partial enhanced scan technique, in [12], dummy flip-flops are inserted to break shift dependency between selected pairs of adjacent scan flip-flops in the scan chain. In [9, 11], scan flip-flops are rearranged to minimize the number of pairs of adjacent scan flip-flops that drive same fanout cones. This reduces the number of transition delay faults that are untestable due to shift dependency between scan flip-flops. However, rearranging scan chains to enhance fault coverage may increase scan path routing overhead. Furthermore, for circuits where most state inputs are topologically correlated, satisfactory transition delay fault coverage may not be achieved in any order of scan flip-flops.

A simple example shows some problems with conventional approaches. FIG. 1 shows a circuit that has three state inputs, $s_1$, $s_2$, and $s_3$, which are respectively driven by scan flip-flops $D_1$, $D_2$, and $D_3$ during test application. Consider generating a test pattern pair $V = \{V_1, V_2\}$ for the slow-to-rise (STR) fault at line l that is to be applied to the circuit by using the conventional skewed-load approach. Initializing line l to a 0 requires assigning either $s_1$ or $s_2$ to a 0 at initialization test cycle $T_1$. On the other hand, activating and propagating the STR fault at line l require assigning all state inputs $s_1$, $s_2$, and $s_3$ to 1's at activation and propagation test cycle $T_2$. However, if $D_1$ ($D_2$) is loaded with a 0 at time $T_1$ to initialize line l, then the 0 at $D_1$ ($D_2$) shifts to $D_2$ ($D_3$) at the next cycle $T_2$ and $s_2$ ($s_3$) is assigned a 0. This conflicts with the value 1, which is required at $s_2$ ($s_3$) to activate and propagate the fault effect. Hence, the STR fault at line l is untestable by the skewed-load approach in standard scan environment.

3. Definitions and Notations

Several definitions and notations are provided herein for a better understanding of this disclosure. It should be noted that these are only illustrative and should not be construed to limit the scope of the claimed invention. In this disclosure it is assumed that the sequential circuit under test (CUT), which has m primary inputs, $p_1, p_2, \ldots, p_m$, and n state inputs, $s_1, s_2, \ldots, s_n$, employs full scan and state input $s_i$, where $i=1, 2, \ldots, n$, is driven by a corresponding scan flip-flop $D_i$ during test application. It is also assumed that all scan flip-flops in the CUT, $D_1, D_2, \ldots, D_n$, where n is the number of scan flip-flops in the scan chain (state inputs), are connected to comprise one scan chain without loss of generality. The chain input of the scan chain is connected to the scan input of scan flip-flop $D_1$ and the scan output of $D_1$ is connected to the scan input of $D_2$, and so on, and finally the scan output of $D_n$ is connected to the scan chain output. It is further assumed that the scan path is constructed with only non-inverting outputs of scan flip-flops, which are also used to drive the functional path. Under the assumption, during scan shift cycles, the value loaded into scan flip-flop $D_i$ at time t is always the same as the value at the immediate predecessor of $D_i$, i.e., $D_{i-1}$ at the previous cycle time t−1. The above two assumptions are only for convenience of illustration and the disclosed techniques can be used for CUTs that have multiple scan chains and whose whole or part of scan paths are constructed by inverting outputs of scan flip-flops.

Let $V^j = \{V_1^j, V_2^j\}$ be a two pattern test (or test cube pair), which may be fully or partially specified, where $V_1^j$ is the initialization pattern and $V_2^j$ is the activation and propagation pattern of $V^j$. Each pattern $V_f^j$, where f=1 or 2, consists of two parts: primary input part that is applied to primary inputs and scan input part that is applied to scan inputs.

The scan input part of initialization pattern $V_1^j$ is applied to the CUT at initialization test cycle $T_1^j$ via the scan chain and corresponding activation and propagation pattern $V_2^j$ is applied the CUT at activation and propagation test cycle $T_2^j$ by functional justification (when the broadside-load approach is used) or a shift operation (when the skewed-load approach is used).

If two pattern tests are applied via standard scan chains by using the skewed-load approach, all transition delay faults that require a 1 (0) at state input $s_{i-1}$ at the initialization test cycle and a 0 (1) at state input $s_i$ at the activation and propagation test cycle to be detected are untestable even if they are testable in enhanced scan environment. Hence, a pair of values, the value assigned at $s_{i-1}$ in $V_1^j$ and the value assigned at $s_i$ in $V_2^j$ are important to determine testability of transition delay faults when the skewed-load approach is used. We introduce $d_i^j$ to denote the pair of values, i.e., the value assigned at $s_{i-1}$ in $V_1^j$ and the value assigned at $s_i$ in $V_2^j$. If two pattern test $V^j$ is applied via a standard scan chain by using the skewed-load approach and $V^j$ is fully specified, then $d_i^j$ is always 00 or 11.

Unlike state inputs, it is assumed that primary inputs are fully controllable, i.e., completely independent patterns can be applied to primary inputs at any two consecutive test cycles.

II. SUMMARY

It will be significantly advantageous to overcome problems noted above and to enhance fault coverage for standard scan designs.

To overcome some of the problems discussed above there is provided a logic circuit comprising at least one input, one output and a delay fault circuit. The delay fault circuit includes a first standard scan cell, a combinational test point positioned immediately after the first standard scan cell in a scan chain and a second standard scan cell positioned immediately after the combinational test point in the scan chain.

In a specific enhancement, the combinational test point is positioned to prevent shift dependency between the first standard scan cell and the second standard scan cell.

In another specific enhancement the first and second standard scan cells are flip-flops.

In another specific enhancement the combinational test point comprises an AND gate.

In another specific enhancement the combinational test point comprises an OR gate.

In another specific enhancement the combinational test point comprises an AND-OR gate.

In another specific enhancement the logic circuit is testable under a full standard scan environment.

In another specific enhancement the logic circuit is testable under a partial standard scan environment.

In another specific enhancement the logic circuit includes at least one enhanced scan cell.

In another specific enhancement the circuit is structured so that at least one stuck-at fault in the circuit can be tested.

In another specific enhancement the circuit is structured so that at least one delay fault in the circuit can be tested.

Another aspect of the disclosed teaching is a logic circuit comprising at least one input, one output and a delay fault circuit. The delay fault circuit including a first standard scan cel, a test point positioned immediately after the first standard scan cell in a scan chain and a second standard cell positioned immediately after the test point in the scan chain. The test point is positioned to prevent shift dependency identified to occur between the first and second standard scan cells in the delay fault circuit.

In a specific enhancement the position of the test point is determined based on a functional analysis of the circuit.

In another specific enhancement the test point is a dummy scan flip-flop in a scan chain that does not provide input to any primary inputs in the logic circuit.

In another specific enhancement the test point is a combinational test point.

In another specific enhancement the position of the test point is determined by identifying dependency untestable transition delay faults. For every such fault, generating a test cube pair for the fault if the fault has a minimum test generation cost, and if there is no conflict with any other test cube pair in a current test cube pair set, adding the test cube pair into the current test cube pair set and updating a current test point vector based on the current test cube pair set; and generating a global test point vector based on the current test point vector, where the global test point vector specifies the position where the test point should be inserted.

In another specific enhancement, the global test vector also specifies what type of test point should be inserted.

Another aspect of the disclosed teachings is a technique for testing a logic circuit comprising loading a first test pattern into a first standard scan cell in a scan chain, loading an output of the first standard cell into a combinational test point in the scan chain; and loading an output of the combinational test point into a second standard scan cell in the scan chain.

In another specific enhancement the combinational test point prevents shift dependency between the first standard scan cell and the second standard scan cell.

In another specific enhancement at least one stuck-at fault in the logic circuit is tested.

In another specific enhancement at least one delay fault in the logic circuit is tested.

Another aspect of the disclosed teachings is an integrated circuit comprising at least one logic circuit and at least one delay fault circuit. The delay fault circuit includes a first standard scan cell in a scan chain, a combinational test point positioned immediately after the first standard scan cell in the scan chain and a second standard scan cell positioned immediately after the combinational test point in the scan chain.

In another specific enhancement the first and second scan cells are flip-flops.

In another specific enhancement the combinational test point is positioned to prevent shift dependency between the first standard scan cell and the second standard scan cell.

In another specific enhancement the combinational test point further comprises an AND gate, an OR gate, or an AND-OR gate.

Yet another aspect of the disclosed teachings is amethod for designing a circuit that is testable using a scan-based technique comprising accurately identifying, based on a functional analysis of the circuit, at least one pair of standard scan cells in the circuit where shift dependency occurs and inserting a test point at the identified point in the circuit.

In a specific enhancement the inserted test points are dummy scan memories.

In another specific enhancement the points in the circuit where shift dependency occurs are identified using an automatic test program generator (ATPG).

More specifically, the ATPG identifies scan memories between which the test points are inserted.

Still another aspect of the disclosed teachings is a method of testing a circuit comprising applying a first set of two pattern tests using a skewed-load approach under standard scan environments. A second set of two pattern tests that target faults that are not detected in step a is applied using a broadside-load approach under standard scan environments. Test efforts required for remaining faults are divided into a plurality of sub-phases and under each sub-phase enabling a different set of test points in every activation and propagation test cycle while the test points other than said different set of test points remain disabled.

In a specific enhancement standard scan environments comprise testing environments where only a subset of all possible combination of test pattern pairs are applied to test the circuit.

In another specific enhancement the circuit includes test points at points in the circuit where shift dependency occurs in a standard scan environment.

In another specific enhancement during the skewed-load approach, a second pattern from the first set of two patterns is obtained by shifting in a first pattern from the two patterns by one scan memory element.

In another specific enhancement during the broadside-load approach, a second pattern from the second set of two patterns is obtained by a response of the circuit to the first pattern.

In another specific enhancement when test points are disabled for each first flip-flop and second flip-flop, the first and second flip-flops being adjacent in a scan chain, a value of the second flip-flop at a test cycle is maintained to be the same as a value of the second flip-flop at a previous test cycle.

In another specific enhancement when a test point is enabled for each first flip-flop and second flip-flop, the first and second flip-flops being adjacent in a scan chain, a value of the second flip-flop at a test cycle is altered by the test point between the first and second flip-flops.

More specifically at least two compatible test point signals are grouped together to be driven by a common control signal.

More specifically at least a at least two inversely compatible test points are grouped together to be driven by a common control signal.

Yet another aspect of the disclosed teachings is a method for designing test points for testing a circuit and identifying test points that should be enabled during each sub-phase of the testing, comprising: a) identifying dependency untestable transition delay faults; b) initializing global variables; c) initializing a current test cube pair set and a current test point vector; d) stopping the procedure if no more untested fault exists in a fault list; e) selecting and marking an unmarked fault that has a minimum test generation cost in the fault list;f) generating a test cube pair for the unmarked fault; g) if the test cube pair generated in step f cannot be added to the current test cube pair set due to a conflict with any other test cube pair in the current test cube pair set, discarding the generated test cube pair and going to step e; h) adding the generated test cube pair into the current test cube pair set and updating the current test point vector accordingly; and i) if no more test cube pair can be added into the test cube pair set without conflict with other test cube pairs in the current test cube pair set, updating a global test point vector and going to step c.

In a specific enhancement dependency untestable faults comprise faults that are not testable under standard scan environments but are testable under full enhanced scan environments.

In another specific enhancement full enhanced scan environments comprise testing environments where all possible combination of test pattern pairs are applied to test the circuit.

In another specific enhancement standard scan environments comprise testing environments where only a subset of all possible combination of test pattern pairs are applied to test the circuit.

In another specific enhancement in step f a test cube pair is generated such that a minimum number of test points are generated considering the current test point vector and the global test point vector.

In another specific enhancement the test cube pair is generated for two different time frames, one for an initialization pattern and another for a propagation pattern.

In another specific enhancement when more than one backtrace is possible, a backtrace path that generates minimum controllability costs are used.

In another specific enhancement controllability costs include a first time frame controllability cost and a second time frame controllability cost.

In another specific enhancement controllability costs include hardware cost to be incurred when a line in the circuit is set to a binary value.

In another specific enhancement a test pair is generated consider a test generation cost that is a sum of a controllability cost for an initialization, a controllability cost for activation and an observability cost which is a minimum cost for transferring an output of a propagated fault to a primary output of the circuit.

Other aspects of the disclosed teachings are computer program products, including a computer readable media comprising instructions, wherein said instructions comprise instruction for enabling a computer to perform testing for circuits using a scan-based technique using the above procedures.

III. BRIEF DESCRIPTION OF THE DRAWINGS

The disclosed teachings will become more apparent by describing in detail examples and embodiments thereof with reference to the attached drawings in which.

FIG. 3(a)–(d) illustrates example implementations of four different types of test points that can be inserted to enhance transition.

Figure 4:
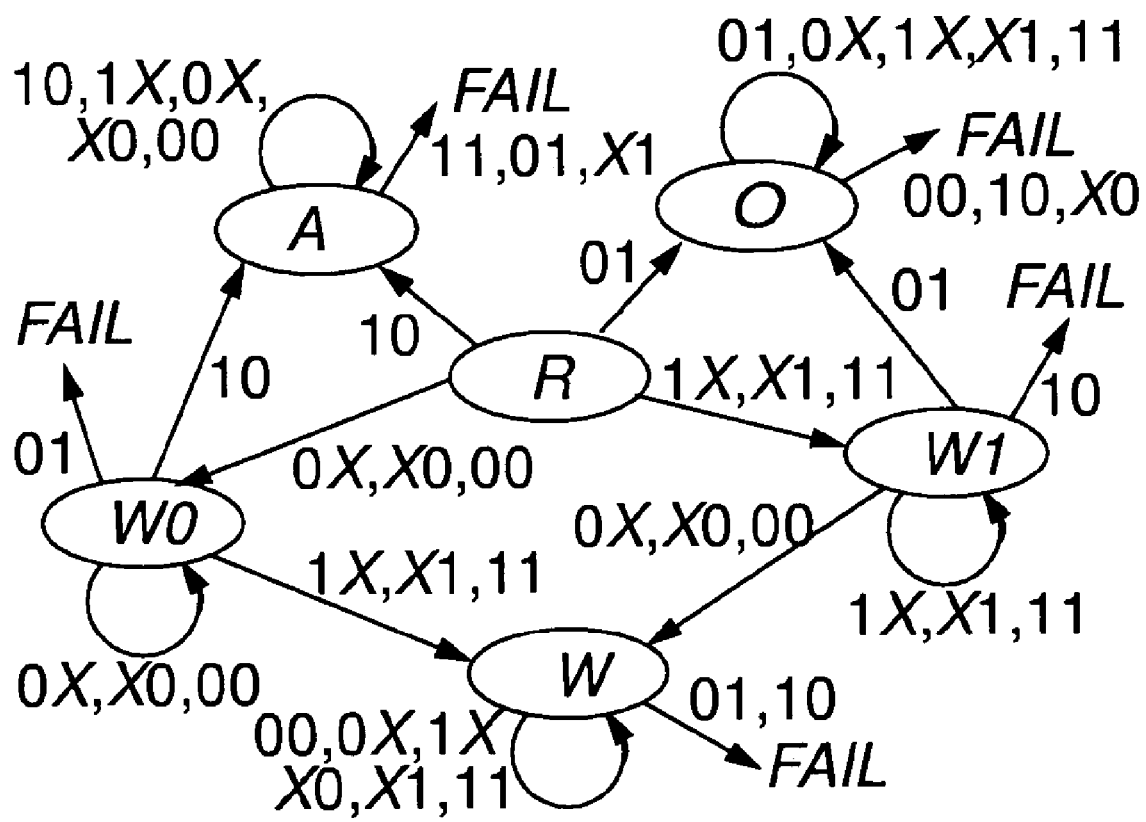

FIG. 4 shows an illustrative test point vector computation finite state machine.

FIG. 5 shows example test cube sets and test point vectors.

FIG. 6 shows an example of clustering test point enabled signals.

Figure 7:
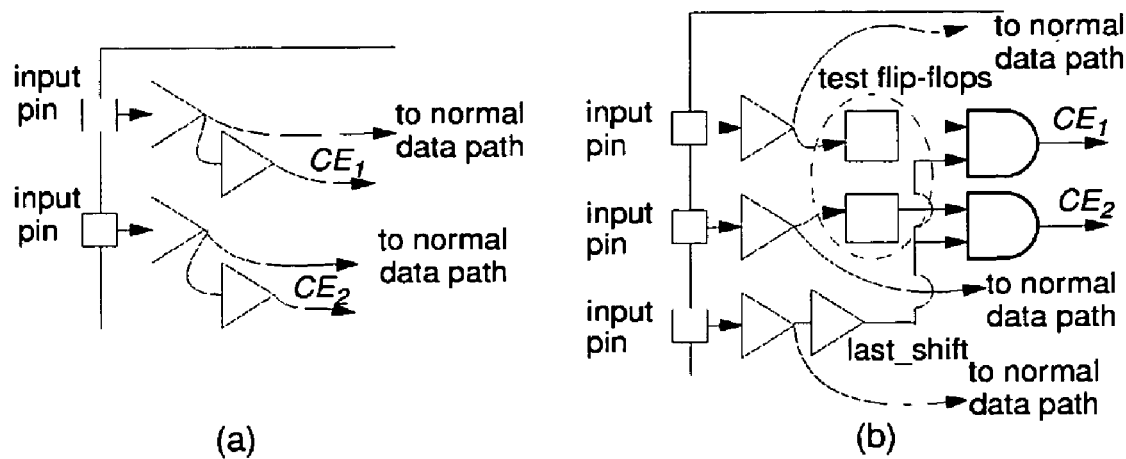

FIG. 7(a)–(b) shows controlling cluster test point enable signals using test input pins and test flip-flops respectively.

FIG. 8 depicts a table showing experimental results.

IV. DETAILED DESCRIPTION

IV.A. Synopsis and Advantages

This disclosure teaches an ATPG-based technique to enhance delay fault coverage for standard scan designs. Since necessary test points are identified from suitable test cube pairs for target faults, which are generated by a special ATPG, rather than circuit topology, it can drastically reduce hardware overhead compared to circuit topology-based techniques. Unlike the conventional technique described on [12], which uses only flip-flops to break shift dependency between adjacent scan flip-flops, the disclosed technique inserts combinational gates as well as flip-flops. This can minimize the increase in scan chain lengths, which determines test application time in scan testing, due to adding extra flip-flops into scan chains. Since combinational gates can be implemented with less silicon area, this can also reduce hardware overhead.

It should be noted that even thought the examples and illustrations show scan flip-flops, the techniques are extendible to any types of memory elements that are used instead of flip-flops.

IV.B. Motivation

Figure 1:
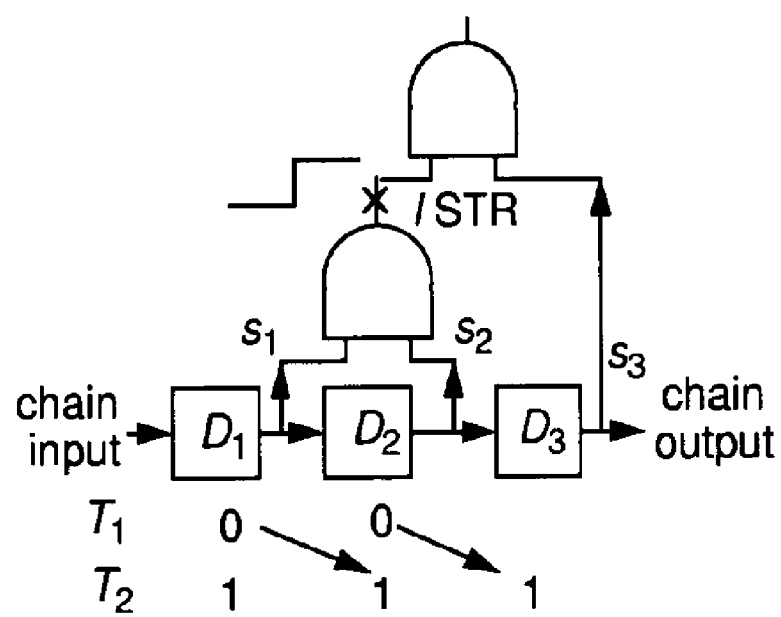
FIG. 1 shows an example of shift dependency.
Figure 2:
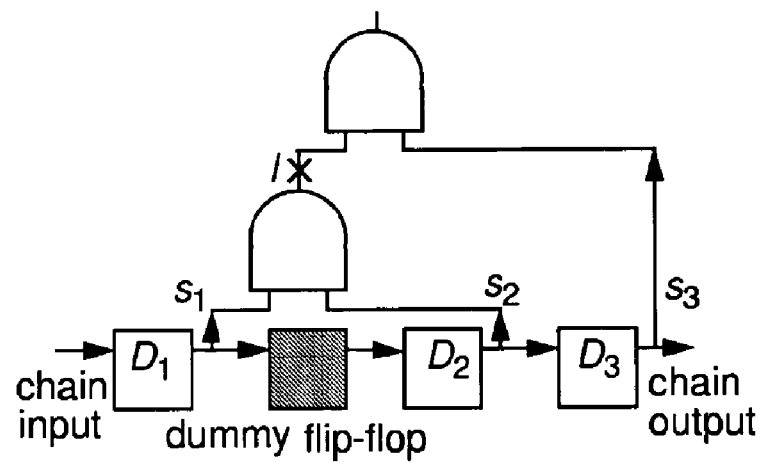
FIG. 2 shows examples illustrating how shift dependency is broken by (a) inserting a dummy flip-flop and (b) inserting an OR gate.
Figure 2:
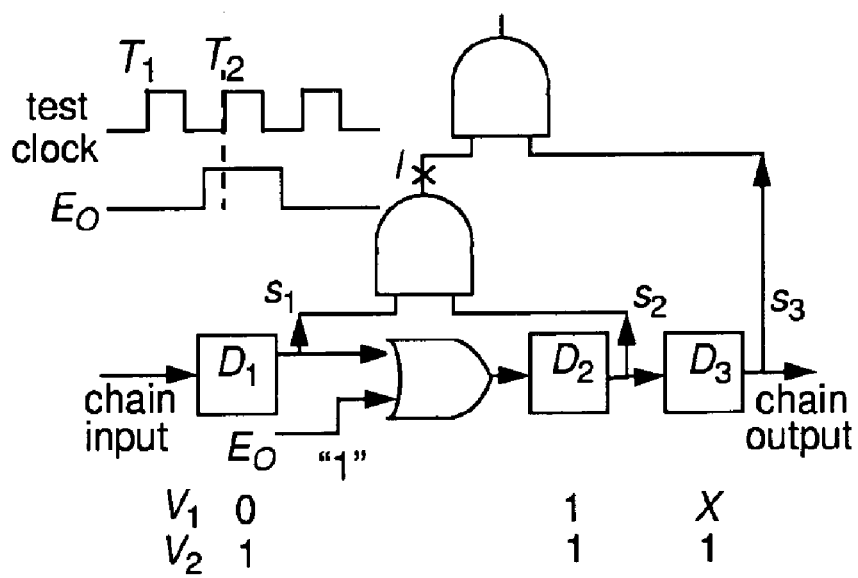

Unlike as in the non-limiting example of FIG. 1, consider inserting a dummy scan flip-flop between $D_1$ and $D_2$ (see FIG. 2(a)). Again, if $D_1$ is assigned a 0 at $T_1$, then the 0 at $D_1$, which is applied to initialize line 1 at $T_1$, shifts to the dummy flip-flop at the next cycle $T_2$. If the dummy flip-flop is loaded with a 1 and $D_2$ is also loaded with a 1 at $T_1$, these 1's shift to $D_2$ and $D_3$ at $T_2$, respectively. Hence, if a 1 is scanned into $D_1$ from the scan chain input at $T_2$, then all state inputs $s_1$, $s_2$, and $s_3$ are assigned 1's and the fault effect at 1 is activated and propagated to the circuit output at $T_2$.

IV.C. Examples Illustrating Concepts Underlying the Disclosed Teachings

FIG. 2(b) illustrates that the STR fault at 1 can also be detected by inserting a two-input OR gate between $D_1$ and $D_2$. Assume that $D_1$ is assigned a 0 and $D_2$ and $D_3$ are assigned 1's at $T_1$. If signal $E_o$ which drives an input of the OR gate, is assigned a 1 at $T_2$ then $D_2$ is loaded with a 1 instead of the 0, which is shifted from $D_1$. Hence, scan flip-flops $D_2$ and $D_3$ can be assigned 1's at $T_2$ that are required to activate and propagate the STR at 1 ($D_1$ can be assigned a 1 by scanning a 1 into the scan chain input at $T_2$). In the disclosed techniques, test points are inserted into the scan path. Because of inserting test points in scan paths, no performance degradation is entailed by inserted test points.

An advantage of inserting combinational gates as test points over dummy flip-flops, which can also be considered as a special type of test point, is that combinational gates such as two-input AND and OR gates can be implemented with less silicon area than flip-flops. Second, test application time of scan testing is typically determined by the number of test patterns and the scan chain length, which is determined by the number of scan flip-flops in the longest scan chain. Hence, inserting dummy scan flip-flops increases test application time by increasing the scan chain length.

In contrast, inserting a combinational gate does not increase scan chain length. Another advantage is reduction in test data volume. Since test data should be provided for inserted dummy flip-flops as well as regular scan flip-flops, inserting dummy flip-flops increases test data volume, which is one of the major factors that determine test cost. Test data to control test points should be provided also to combinational test points from an external ATE. Hence, it is of importance to minimize the number of test points to minimize test data volume. Algorithms to minimize the number of test points are described in subsequent sub-sections. Test data to control test points are further reduced by merging control signals for multiple test points into a single control signal and driving these merged control signals by a control register rather than external input pins (see Section IVG).

Figure 3:
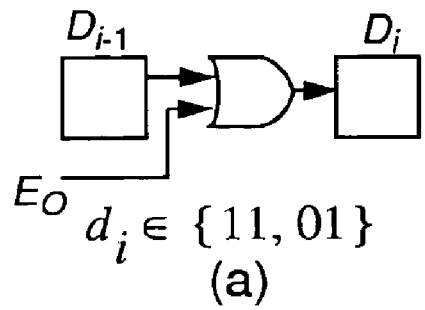
Figure 3:
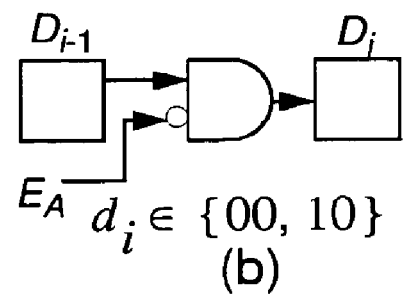
Figure 3:
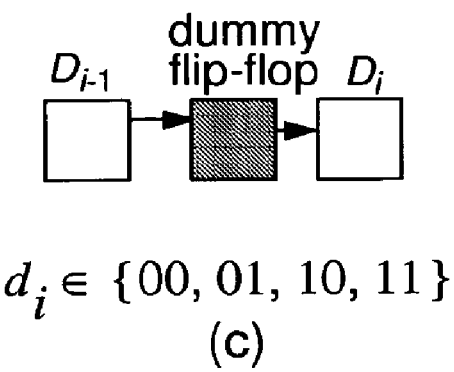
Figure 3:
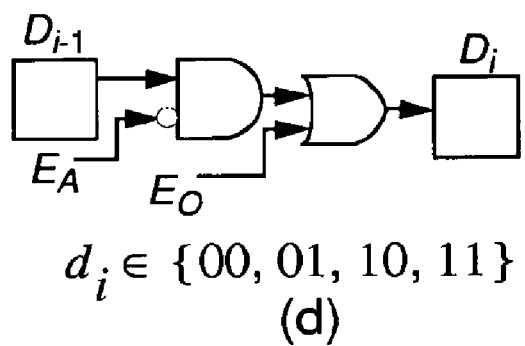

FIG. 3 provides illustrative, non-limiting examples of four different types of test points that can be inserted to enhance transition delay fault coverage for standard scan designs and their possible $d^j_i$ values, i.e., the value assigned at state input $s_{i-1}$ in $V^j_1$ and the value assigned at state input $s_i$ in $V^j_2$, that can be applied to a pair of adjacent state inputs $s_{i-1}$ and $s_i$ when each different type of test point is inserted between $D_{i-1}$ and $D_i$. Note that $d^j_i=01$ or 10 cannot be applied in standard scan environments (Note that in this example it is assumed that the scan path is constructed with only non-inverting outputs of scan flip-flops).

If an AND gate is inserted between scan flip-flops $D_{i-1}$ and $D_i$, $d^j_i$ values that can be applied to $s_{i-1}$ and $s_i$ are 00 and 10. Hence, if there exists a dependency untestable transition delay fault that requires $d^j_i=01$ to be detected, then the fault can be detected by inserting an OR gate between $D_{i-1}$ and $D_i$.

Likewise if an OR gate is inserted between scan flip-flops $D_{i-1}$ and $D_i$, $d^j_i$ values that can be applied to $s_{i-1}$ and $s_i$ are 11 and 01. Hence, if there exists a dependency untestable transition delay fault that requires $d^j_i=10$ to be detected, then the fault can be detected by inserting an AND gate between $D_{i-1}$ and $D_i$.

If there is a set of transition delay faults that require $d^j_i=01$ to be detected and there is another set of faults that require $d^j_i=10$ to be detected, then an AND-OR (or OR-AND) complex gate or dummy flip-flop can be inserted between $D_{i-1}$ and $D_i$ to detect all of them. While test patterns for a set of transition delay faults that require $d^j_i=01$ to be detected are being applied to the CUT, the test point enable signal for the OR test point, $E_o$, is set to a 1 to enable the OR test point at every activation and propagation test cycle. On the other hand, while two pattern tests for the other set of transition delay faults that require $d^j_i=10$ to be detected are being applied to the CUT, the test point enable signal for the AND test point, $E_A$, is set to a 1 to enable the AND type test point and $E_o$ is set to a 0 to propagate the 0 at the output of the AND gate to the scan input of $D_i$.

Also when an AND test point is inserted, the test point needs to be disabled while test patterns for faults that require $d^j_i=11$, i.e., $s_{i-1}=1$ (0) in $V^j_1$ and $s_i=1$ in $V^j_2$, to be detected are applied. Likewise when an OR test point is inserted, the test point needs to be disabled while test patterns for faults that require $d^j_i=00$, i.e., $s_{i-1}=0$ in $V^j_1$ and $s_i=0$ in $V^j_2$, to be detected are applied.

The test application as in the disclosed teachings includes three phases. In the first test application phase, two pattern tests are applied by the skewed-load approach under standard scan environment. In the second application phase, test patterns, which target faults that are not detected during the first test application phase, are applied by the broadside-load approach also under standard scan environment. The first and the second phase can be exchanged without affecting resulting quality of testing. The third application phase is further divided into several sub-phases.

In each sub-phase of the third phase, a different set of test points are enabled every activation and propagation test cycle and the rest of test points are always disabled. For all pairs of adjacent scan flip-flops $D_{i-1}$ and $D_i$ whose test points are disabled, the value at flip-flop $D_i$ at test cycle t is the same as the value at its immediate predecessor $D_{i-1}$ at the previous test cycle t−1.

IV.D. Comparisons with Prior Work

Unlike combinational test points such as AND and OR gates, dummy flip-flops require no test point enable signals, which entail additional routing overhead. However, dummy flip-flops contribute to extra power consumption even during normal operation (note that combinational test points do not contribute to power consumption since scan chains are not used during normal operation). Hence, if a large number of dummy scan flip-flops are inserted, then clock signals that drive dummy flip-flops should be shut down during circuit's normal operation to save power in power conscious chips such as chips for portable devices. This requires driving dummy flip-flops with a separate clock tree or through individual clock gating logics. Hence, added clock tree(s) or clock gating logics for dummy flip-flops may cost even higher routing as well as area overhead than test point enable signals of combinational test points. It is well known that power dissipation during test application is often significantly higher than that during normal operation [3, 19, 5] due to excessive switching activity. Since dummy flip-flops can have transitions during entire scan shift cycles contributing to power dissipation, inserting dummy flip-flops will exacerbate this problem. In contrast, since combinational test points can have transitions only at activation and propagation cycles, which occur every n+1 test cycles, where n is the number of scan flip-flops in the longest scan chain, combinational test points contribute to power dissipation very little even during test application.

As described in the preceding paragraph, [9, 12] use topological correlation measures to decide between which pairs of scan flip-flops dummy flip-flops are to be inserted and orders of scan flip-flops that minimize decrease in fault coverage due to shift dependency. In order to break shift dependency between all pairs of adjacent scan flip-flops, a large number of dummy flip-flops need to be inserted for some circuits [12]. If both skewed-load and broadside-load approaches are used, many pairs of adjacent flip-flops that have topological correlation (drive same fanout cones) may not cause any dependency untestable fault since some faults that cannot be detected by the skewed-load approach due to shift dependency between adjacent flip-flops can be detected by the broadside-load approach. Hence, inserting dummy flip-flops, replacing scan flip-flops by enhanced scan flip-flops, or reordering scan flip-flops based only on topological correlation measures, may result in unnecessarily high area and routing overhead.

Unlike [9, 12], [2] uses pre-computed test patterns to select scan flip-flops that are replaced by enhanced scan flip-flops; if there exists pair of adjacent state inputs $s_{i-1}$ and $s_i$ for which $d^j_i$ is 01 or 10 (under the assumption that the scan path is constructed with only non-inverting outputs of scan flip-flops) in a two pattern test $V^j$ of the pre-computed test pattern set, scan flip-flop $D_i$ is replaced by an enhanced scan flip-flop. Typically, there may be a large number of two pattern tests for every dependency untestable transition delay fault. Hence, significantly different results in terms of hardware overhead can be obtained depending on which test patterns are used for consideration. In contrast to [2] where test patterns are generated in advance, in the disclosed technique, only suitable test cube pairs, which will result in minimal number of test points, are generated by a special ATPG.

IV.E. Scan Path Test Point Insertion

It is important to minimize the number of test points to minimize hardware overhead and test data volume. In the disclosed technique, one way of determining the test points to be inserted is to dynamically compute from test cube pairs for transition delay faults that are not testable in standard scan environment. A test cube pair generated thus is added to a test cube pair set, which is called the current test cube pair set. For example, if there currently exists test cube pair $V^a$ in the current test cube pair set in which values for a pair of adjacent state inputs $s_{i-1}$ and $s_i$ are assigned a 0 in $V^a_1$ and a 1 in $V^a_2$, respectively, i.e., $d^a_i=01$, then an OR gate is required to be inserted and enabled between scan flip-flops $D_{i-1}$ and $D_i$ to apply $V^a$ to the CUT (see FIG. 3). If $d^b_i=00$ in a newly generated test cube pair $V^b$, then $V_b$ conflicts with $V^a$ at $s_i$ since $V^b$ cannot be applied to the CUT with the OR gate enabled between $D_{i-1}$ and $D_i$. Generated test cube pairs are placed into the current test cube pair set until no more test cube pairs can be added without conflict with test cube pairs that already exist in the test cube pair set.

1. Test Point Vector

A test point vector, which carries information on which test points are enabled in the corresponding test application sub-phase, is computed from a set of test cube pairs. The test point vector for k-th test cube pair set, $TP_k=\{tp^k_1, tp^k_2, \ldots, tp^k_n\}$, is an n-bit tuple where $tp^k_i \in \{W, O, A\}$, (i=1, 2, 3, \ldots, n, where n is the number of state inputs) is computed from test cube pair set $C^k$ as follows: if there is at least one two pattern test cube pair $V^j$ in set $C^k$ where $d^j_i=01$, i.e., $s_{i-1}=0$ in $V^j_1$ and $s_{i=1}$ in $V^j_2$, then $tp^k_i$ is assigned O; otherwise $tp^k_i$ is assigned W. Likewise, if there is at least one two pattern test cube pair $V^j$ in set $C^k$ where $d^j_i=10$, i.e., $s_{i-1}=1$ in $V^j_1$ and $s_{i=1}$ in $V^j_2$, then $tp^k_i$ is assigned A; otherwise $tp^k_i$ is assigned W. If $tp^k_i=W$, no test point between $D_{i-1}$ and $D_i$, if any, is enabled during the k-th test application sub-phase. Therefore, if $tp^k_i=W$, the value assigned to $s_i$ at every activation and propagation test cycle $T^r_2$, (r=1, 2, \ldots, yk, where yk is the number of two pattern tests applied during k-th test application sub-phase) is always the same as the value assigned to $s_{i-1}$ at the corresponding initialization test cycle $T^r_1$ during the entire k-th test application sub-phase. On the other hand, if $tp^k_i=O$, a two-input OR gate is inserted and enabled between $D_{i-1}$ and $D_i$ and $s_i$ is always assigned a 1 at every activation and propagation test cycle $T^r_2$ independent of the value assigned to $s_{i-1}$ at initialization test cycle $T^r_1$ during the entire k-th test application sub-phase. Likewise, if $tp^k_i=A$, a two-input AND gate is inserted and enabled between $D_{i-1}$ and $D_i$ and $s_i$ is always assigned a 0 at every activation and propagation test cycle $T^r_2$ independent of the value assigned to $s_{i-1}$ at initialization test cycle $T^r_1$ during the entire k-th test application sub-phase.

When a new test cube pair is added into the current test cube pair set, the test point vector is incrementally updated according to values assigned in the new test cube pair. In addition to symbols W, O, and A, symbols R, W0 and W1 are used as intermediate symbols during test point vector computation processes. The three intermediate symbols are used to compute a final test point vector for a test cube pair set and do not appear in any final test point vector that is used to determine test points to be enabled during each test application sub-phase; upon completion of computing a test point vector, all intermediate symbols in the test point vector are replaced by W's to produce a final test point vector. The finite state machine shown in FIG. 4 depicts a non-limiting illustrative procedure to calculate test points.

In this example, for every test point vector $TP^k$ (k=1, 2, \ldots, $k_{max}$, where $k_{max}$ is the number of test point vectors), initially, all state inputs except the state inputs that have no topological correlation with their immediate predecessor state inputs are assigned initial values R's (state R of the finite state machine shown in FIG. 4. In the rest of this disclosure, a pair of topologically correlated adjacent scan flip-flops and a pair of adjacent scan flip-flops that drive the same fanout cones are interchangeably used. The state inputs that do not drive any fanout cone that is driven by their immediate predecessor state inputs are assigned W's in every test point vector. Unlike initial R symbols, which may be updated to other symbols later in the test point vector computation process according to values assigned in test cube pairs added into the test cube pair set, the initial W symbols are fixed and do not change until the final test point vector is obtained. Since those state inputs that have no topological correlation with their immediate predecessor state inputs cause no dependency untestable transition delay faults, no test points need to be inserted in front of them. The scan flip-flop $D_1$ located first in the scan chain is always assigned W in every test point vector.

Consider adding the first test cube pair $V^j$ into the current test cube pair set $C^k$. If $tp^k_i=R$ and $d^j_i=10$ in $V^j$, then $tp^k_i$ is updated to A (the state transition from state R to state O (A) of FIG. 4). Likewise, if $tp^k_i=R$ and $d^j_i=01$ in $V^j$, then $tp^k_i$ is updated to O Otherwise, if state input $s_i$ is assigned R in the initial test point vector, and $d^j_i=00$ in $V^j$, then $tp^k_i$ is updated to W0 (the transition from state R to state W0 of FIG. 4). Note that $d^j_i=00$ can be applied with and without an AND test point between $D_{i-1}$ and $D_i$ (see FIG. 3(b)). Hence, in this case, the final decision on the type of test point to be enabled between $D_{i-1}$ and $D_i$ is postponed and an intermediate symbol W0 is assigned to $tp^k_i$. If a test cube pair $V^a$ where $d^a_i=10$, is added later in the process, $tp^k_i$ is updated to A (the state transition from W0 to A in the finite state machine). Instead, if a test cube pair $V^b$ where $d^b_i=11$ is added, then $tp^k_i$ is updated to W (note that $d^b_i=11$ cannot be applied if an AND test point is enabled between $D_{i-1}$ and $D_i$). Otherwise, no test cube pair $V^c$ where $d^c_i$ is either 10 or 11 is added until no more test cube pairs can be added into the test cube pair set without conflict, the intermediate symbol W0 is replaced by W in the final test point vector.

Note that no matter what binary value is assigned to the X if $d^j_i=0X$ or X0, the fault targeted by $V^j$ can be detected. If the X is assigned a 1, i.e., $d^j_i=01$ or 10, then $tp^k_i$ is updated to O or A, respectively, and an OR test point should be inserted between $D_{i-1}$ and $D_i$ if currently no OR test point is inserted between $D_{i-1}$ and $D_i$. In contrast, if the X is assigned a 0, then $tp^k_i$ will be assigned W0, which requires no test point. Hence, it is more suitable to assign a 0 to the X.

Hence, when $d^j_i=0X$ or X0, $tp^k_i$ is updated to W0 (if $d^j_i=0X$ or X0, state R transitions to state W0 in the finite state machine shown in FIG. 4) The transition from state R to state W1 is similar to the transition from state R to state W0.

Once $tp^k_i$ is assigned A, then no test cube pairs where $d^j_i=11$, 01, or X1 can be added into the current test cube pair set without conflict with test cube pairs already existing in the test cube pair set. Likewise, once $tp^k_i$ is assigned O, then no test cube pairs where $d^j_i=00,10$, and X0 can be added into the current test cube pair set without conflict with test cube pairs already existing in the test cube pair set. Recall that if $tp^k_i=A$, then $s_i$ is always assigned a 0 at every activation and propagation test cycle during the entire k-th test application sub-phase. Likewise, recall that if $tp^k_i=O$, then $s_i$ is always assigned a 1 at every activation and propagation test cycle during the entire k-th test application sub-phase. This is described as the transition from state O to state FAIL in FIG. 4.

EXAMPLE

FIG. 5 illustrates calculating test point vectors for two example sets of test cube pairs: $C^1$ and $C^2$. Assume that adjacent pairs of state inputs, $s_2$ and $s_3$, $s_4$ and $s_5$, and $s_5$ and $s_6$, drive different fanout cones. Therefore, $tp^k_3$, $tp^k_5$, and $tp^k_6$, where k=1,2, are always assigned W's in every test point vector. When test cube pair $V^1$ is added to $C^1$, $tp^1_2$ is updated to O since $s_1$ is assigned a 0 in $V^1_1$ and $s_2$ is assigned a 1 in $V^1_2$, i.e., $d^1_2=01$, and $tp^1_4$ and $tp^1_7$ are updated to W0 since $d^1_4=d^1_7=X0$ in $V^1$. When test cube pair $V^2$ is added to $C^1$, $tp^1_4$ is updated to A since $d^2_4=10$. On the other hand, $tp^1_7$ holds the previous value W0 since $d^2_7=00$. Assume that no test cube pair can be added to $C^1$ without conflict after $V^2$ is added. Now, all intermediate symbols, R, W0, and W1, are replaced by W; in the example, the W0 assigned to $tp^1_7$ is replaced by W to produce the final test point vector $TP^1=\{W, O,W,A,W,W,W\}$.

The test point vector $TP^2$ for test cube pair set $C^2$ also starts with the same initial vector $TP^2=\{W,R,W,R,W,W,R\}$ as initial $TP^1$. Since $d^3_2$, $d^3_4$, and $d^3_7$ are respectively assigned X0, 10, and 11 in $V^3$, $TP^2$ is updated to $\{W,W0, W,A,W,W,W1\}$ when $V^3$ is added into $C^2$. Since $d^4_2=10$ and $d^4_7=01$ in $V^4$, $tp^2_2$ and $tp^2_7$ are again updated to A and O, respectively, when $V^4$ is added into $C^2$.

2. Global Test Point Vector

Hardware overhead for implementing the disclosed technique is determined by the number of inserted test points. The types of test points that will be inserted between each pair of adjacent scan flip-flops are expressed in the global test point vector, $GTP=gtp_1, gtp_2, \ldots$, where n is the number of flip-flops in the scan chain and $gtp_i \in \{W, A, O, AO\}$ (i=1,2,..., n). The global test point vector GTP is obtained from test point vectors as follows: If $tp^k_i$, where k=1, 2, ..., $k_{max}$, where $k_{max}$ is the number of test point vectors (test cube pair sets), is assigned only W or O and assigned O in at least one test point vector, then $tp^k_i$ is assigned O. Likewise, if $tp^k_i$, is assigned only W or A and assigned A in at least one test point vector, then $tp^k_i$ is assigned A. Otherwise, $tp^k_i$ is always assigned W in every test point vector, then no test point is necessary between $D_{i-1}$ and $D_i$ and $gtp_i$ is assigned W. Finally, if $tp^k_i$ is assigned O in at least one test point vector and also assigned A in at least one test point vector, then both AND and OR test points should be inserted between $D_{i-1}$ and $D_i$ and $gtp_i$ is assigned AO, i.e., AND-OR complex gate. The global test point vector is updated upon completion of a test point vector computation process.

It is assumed that two-input AND and OR gates and AND-OR gates are used as test points in the illustrative non-limiting examples used in this disclosure. Hence, only symbols A, O, and AO are defined for the global test point vector GTP. However, the disclose technique can be extended to include other types of test points such as dummy flip-flops and/or XOR gates by adding appropriate symbols to represent new types of test points. Results obtained by using two-input AND and OR gates and dummy flip-flops as test points are also presented and compared with results obtained by using two-input AND and OR gates and AND-OR gates as test points in Section IV.I.

Test point enable signals are created from the global test point vector as follows: If state input $s_i$ is assigned AO in the global generator, then two test point enable signals, $E_{i,o}$ and $E_{i,A}$ are created to control the AND-OR gate that is inserted between $D_{i-1}$ and $D_i$. If state input $s_i$ is assigned O, then one test point enable signal, $E_{i,o}$, is assigned to control the OR gate. Likewise, if state input $s_i$ is assigned A, then one test point enable signal, $E_{i,A}$, is assigned to control the AND gate. Note that if dummy flip-flops are used instead of AND-OR complex gates, then no test point enable signals are necessary (however dummy flip-flops require additional clock signals). Test point enable signals for test point vectors shown in FIG. 5 are shown in FIG. 6. Since state input $s_2$ is assigned AO in the global test point vector, two test point enable signals, $E_{2,A}$ and $E_{2,o}$ are assigned for $s_2$ to control the AND-OR test point, which is inserted between scan flip-flops $D_1$ and $D_2$. On the other hand, one test enable signal $E_{4,A}$ is assigned for state input $s_4$, which is assigned A in the global test point vector. Likewise, one test enable signal $E_{7,o}$ is assigned for state input $s_7$, which is assigned O in the global test point vector.

IV.F. The Cost Functions of the Disclosed ATPG

The disclosed ATPG, which is developed based on PODEM [7], generates suitable test cube pairs that will lead to the minimum number of test points by taking current test point vector $TP^k$ and the global test point vector GTP into consideration. Controllability, observability, and test generation cost are defined to guide the proposed ATPG to generate a test cube pair that entails the smallest number of new test points when it is added into the current test cube pair set $C^k$.

Since testing transition delay faults requires two pattern tests, the proposed ATPG generates a two pattern test cube pair for every target fault for two different time frames: time frame 1 for the initialization pattern and time frame 2 for the activation and propagation pattern. Therefore, two separate controllability cost functions are defined for each circuit line to take account of the two time frames. The controllability costs are used to guide the proposed ATPG when there are more than one possible backtrace paths for line justification.

The purpose of computing controllability costs of each state input is to estimate hardware cost to be incurred when line l is set to a binary value v. The controllability cost to set line l to a binary value v in time frame f, where f={1, 2}, is denoted by $Cf_v(l)$. At any time in a test generation process, if state input $s_i$ is assigned a 0 (1) in time frame 2, then $C2_0(s\_i)=0$ ($C2_1(s_i)=0$) and $C2_1(s_i)=\infty$ ($C2_0(s_i)=\infty$). $C2_v(s_i)$, where $v \in \{0, 1\}$, is defined by considering the current test point vectors $TP^k$ and the global test point vector GTP as follows: If currently $gtp_i=AO$, then an AND-OR gate is already assigned to the pair of scan flip-flops $D_{i-1}$ and $D_i$ and o further test point is necessary for the pair no matter what values are assigned to $s_{i-1}$ and $s_i$ in test cube pairs added later in the test point vector computation process. Hence, assigning any binary value to $s_i$ does not cost any more test point and $C2_0(s_i)=C2_1(s_i)=0$. On the other hand, if currently $gtp_i=A$ (O), $tp^k_i=R$ or W0 (W1), and $s_{i-1}$ is assigned a 0 (1) in time frame 1, then assigning a 1 (0) to $s_i$ requires a new OR (AND) test point between $D_{i-1}$ and $D_f$ the transition from state R to state O (A) and the transition from state W1 to state O (A) of the finite state machine shown in FIG. 4). Hence, $C2_1(s_i)=h$ ($C2_0(s_i)=h$), where h is a positive number, say 100. There are several cases of $d^j_i$ assignments where the finite state machine shown in FIG. 4 transitions to the state FAIL. Those assignments are forbidden due to conflicts with test cube pairs already existing in the test cube pair set and an infinite cost function is given to those assignments. That is: if $tp^k_i=A$ (O), then $C2_1(s_i)=\infty$ ($C2_0(s_i)=\infty$), if $tp^k_i=W0$ (W1) and $s_{i-1}$ is assigned a 0 (1), then $C2_1(s_i)=\infty$ ($C2_0(s_i)=\infty$), and finally if $tp^k_i=W$ and $s_{i-1}$ is assigned a 0 (1), then $C2_1(s_i)=\infty$ ($C2_0(s_i)=\infty$). For all other cases, $C2_v(s_i)=0$. Since the controllability costs for time frame 1 can be computed in similar fashion to those for time frame 2, the formula for controllability cost for time frame 1 is omitted due to lack of space of this paper. Since no test points are required for primary inputs, controllability costs for all primary inputs are 0.

The controllability costs for internal circuit line l in the circuit, $Cf_v(l)$, where $f \in \{0, 1\}$, which are computed in similar fashion to testability measures used in [8] are given by $$Cf_v(l) = \begin{cases} \min_{l_a} \{Cf_c(l_a)\} & \text{if } v = c \oplus i \\ \sum_{l_a} Cf_c(l_a) & \text{otherwise,} \end{cases} \quad (1)$$

where $l_a$ and l are respectively the inputs and the output of a gate with controlling value c and inversion i. The controllability costs of state input $s_i$ are updated when $s_{i-1}$ is assigned a binary value in time frame 1 or $s_i$ is assigned a binary value in time frame 2 during test generation process and changes of controllability costs of state input $s_i$ are propagated into internal lines directly or transitively driven by $s_i$ to update controllability costs of those internal lines accordingly.

During test generation, all gates whose output values are currently unknown and at least one of whose gate inputs has a fault effect belong to D-frontier [7]. In the disclosed ATPG, a gate that is likely to incur minimum amount of additional hardware to propagate the fault effect at its input is selected from D-frontier repeatedly, until the fault effect reaches one or more primary and state outputs. The observability cost function described below serves as a selection criterion to achieve this objective. The observability cost functions are recursively computed from primary and state outputs to primary and state inputs. The observability cost of line l is given by $$O(l) = \begin{cases} \min_{l_o} \{O(l_o)\} & \text{if } l \text{ is a fanout stem} \\ \sum_{l_a} C\bar{c}(l_a) + O(l_o) & \text{otherwise,} \end{cases} \quad (2)$$

where in the latter case $l_o$ is the output of gate with input l and $l_a$ are all inputs of $l_o$ other than l.

The observability cost of line l is also the minimum cost to propagate a value at line l to one or more primary or state outputs. Note that since the objective of the initialization pattern of a two pattern test is to set line l to a desired value, no fault propagation process is necessary for the initialization pattern. Hence, no observability costs are defined for time frame 1.

In order to generate a test cube pair to detect a STR (STF) fault at line l, the fault should be initialized to a 0 (1) by the initialization pattern and activated by setting line l to a 1 (0) and propagated by the activation and propagation pattern. The cost to initialize line l to a 0 (1) is $C1_o(l)$ ($C1_1(l)$). The cost to set line l to a 1 (0) to activate the fault is $C2_1(l)$ ($C2_0(l)$). Then, the activated fault effect should be propagated to one or more primary and state outputs. The cost to propagate the activated fault effect at line l is $O(l)$. Hence, the test generation cost to generate a test cube pair for the STR fault at line l is defined as the sum of three cost functions:

$$T_{STR}(l)=C1_0(l)+C2_1(l)+O(l).$$

Similarly, the test generation cost to generate a test cube pair for the STF fault at line l is $$T_{STF}(l)=C1_1(l)+C2_0(l)+O(l).$$

IV.G. Clustering Test Point Enable Signals

After test cube pairs for dependency untestable faults, which remain undetected after a set of two pattern tests are applied in standard scan environment, are generated, test points are inserted into the scan path according to values assigned in the global test point vector GTP.

As described in Section IV.E, different test points are enabled in each test application sub-phase. However, many test point enable signals are assigned equivalent values (an X is equivalent and also opposite to any binary value) in every test application sub-phase. Any two test point enable signals Ea,y and Eb,z y ,z $\in$ {O,A}) are not compatible if Ea,y=v and Eb,z=$\bar{v}$ ($v \in \{0, 1\}$) in any generator. Otherwise, Ea,y and Eb,z are compatible. The definition of compatible inputs can be expanded by considering inverse relation, i.e., test point enable signals that are always assigned opposite values. A set of compatible or inversely compatible test point enable signals are grouped together and driven by a common control signal.

For example, in the two test point vectors shown in FIG. 6, $E_{2,A}$ and $E_{4,A}$ are assigned equivalent values ($E_{2,A}$ is a don't care ($E_{2,A}$=X) and $E_{4,A}$ is enabled ($E_{4,A}$=1) in $TP^1$ and $E_{2,A}$=$E_{4,A}$=1 in $TP_2$), $E_{2,o}$ and $E_{7,o}$ are assigned opposite values in both $TP^1$ and $Tp_2$ ($E_{2,o}$=1 and $E_{7,o}$=0 in $TP^1$ and $E_{2,A}$=0 $E_{4,A}$=1 in $TP^2$). Hence, $E_{2,o}$ and $E_{4,A}$ which are always assigned opposite values, are connected through an inverter and driven by cluster test enable signal $CE^1$ and $E_{2,A}$ and $E_{4,A}$ which are always assigned equivalent values, are directly connected and driven by cluster test enable signal $CE^2$. Note that while test point vectors require 4 test point enable signals, $E_{2,A}$, $E_{2,o}$, $E_{4,A}$ and $E_{7,o}$, all test point enabled signals can be controlled by only 2 cluster test enable signals, $CE^1$ and $CE^2$ (see the bottom circuit of FIG. 6).

Since, in this example, a greedy approach is used to find the minimal number of cluster test point enable signals to minimize routing overhead, the first few clusters have a large number of compatible test point enable signals and the rest of clusters contain very few compatible test point enable signals. Typically, the last few clusters contain only 1 compatible test point enable signal. Hence, for circuits that have routing congested area, it is better to replace AND-OR test points that are controlled by cluster test enable signals that drive only 1 test point enable signal with dummy scan flip-flops to reduce routing overhead. (While an AND-OR test point requires two test point enable signals, a dummy flip-flop requires one clock signal as additional routing overhead.)

Cluster test point enable signals can be driven from chip input pins (see FIG. 7(a)) or internal test flip-flops (see FIG. 7(b)). When cluster test point enable signals are driven from external pins, data to control cluster test point enable signals according to values assigned in the corresponding test point vector should be provided to the external chip input pins that drive cluster test point enable signals along with test patterns to be applied to primary and scan inputs from an external ATE. Hence, minimizing the number of cluster test point enable signals also minimizes test data volume. Note that since test point enable signals are controlled only during scan shift cycles during which values at all normal chip input pins (primary inputs) are don't cares, test point enable signals can be shared with normal chip input pins. Therefore, no additional chip input pins are necessary to drive test point enable signals. Sharing test point enable signals with normal chip input pins may entail performance penalty since it increases load capacitance at sharing input pins. However, this performance penalty can be eliminated or minimized by inserting dedicated buffers to drive test point enable signals as shown in FIG. 7(a).

Test data volume can be further reduced by driving cluster test point enable signals by internal test flip-flops as shown in FIG. 7(b). When test flip-flops are used to control cluster test point enable signals, test data to control cluster test point enable signals need to be provided to update values of test flip-flops only when a new test application sub-phase starts. For instance, for the example circuit shown in FIG. 6, test flip-flop $TF_1$ should be loaded with a 0 and $TF_2$ be loaded with a 1 before the first test application sub-phase starts and $TF_1$ and $TF_2$ will hold the loaded values until the second test application sub-phase starts. Before the second test application sub-phase starts, both $TF_1$ and $TF_2$ should be loaded with 1's. Routing overhead for test point enable signals can also be reduced by carefully placing test flip-flops to minimize routing from test flip-flops to the test points that are controlled by corresponding test flip-flops. If the CUT supports boundary scan, then the function of test flip-flops can be provided by the instruction register of the test access port (TAP) controller [16].

IV.H. Overall Algorithm for Test Point Design

Overall algorithm for test point design is outlined below.
1. Identify dependency untestable transition delay faults by running a regular transition delay ATPG under standard scan environment.
2. Initialize global variables; k □ 0, j □ 0, and GTP □ {W, W, . . . , W}.
3. Initialize the current test cube pair set, $C^k$ □ ϕ, and the current test point vector, $TP^k$={W, I, . . . , I}, where I=W if corresponding state input $s_i$ drives no fanout cones that its immediate predecessor state input $s_{i-1}$ drives; otherwise I=R, and unmark all faults in the fault list (see Section IV.E.1).
4. If there are no more faults in the fault list, then go to Step 7. Select an unmarked fault that has the minimum test generation cost in the fault list, mark the fault, and generate a test cube pair $V^j$ for the fault by the proposed ATPG (see Section IV.F).
5. If the generated test cube pair $V^j$ cannot be added into $C^k$ due to conflict with any test cube pair existing in $C^k$, then discard the generated test cube pair and go to Step 4 (see Section IV.E.1).
6. If there exist no more unmarked faults in the fault list for which a test cube pair can be generated without conflict with already existing test cube pairs in $C^k$, then replace all intermediate symbols, R's, W0's, W1's, in the current test point vector $TP^k$ with W's, and generate two pattern tests for all faults for which test cube pairs are added into $C^k$ with test points enabled according to $TP^k$, run fault simulation with the generated two pattern tests to drop detected faults, update the global test point vector according to the final test point vector $TP^k$, increment k by 1, and go to Step 3. Otherwise, add the test cube pair $V^j$ into $C^k$, increment j by 1, and update $TP^k$ accordingly and go to Step 4 (see Section IV.E.1).
7. Insert test points and generate test point enable signals according to the global test point vector (see Section IV.E.2).
8. Find compatible test point enable signals and create cluster test enable signals (see Section IV.G).

IV.I. Experimental Results

Table 1 (shown in FIG. 8) shows experimental results for full scan versions of ISCAS 89 benchmark circuits.

The experiments were conducted on a SUN® Microsystem's Ultra 1® with 1 Giga bytes of memory. The column # FFs shows the number of scan flip-flops in each benchmark circuit. Experiments were conducted for two different versions of circuits whose scan flip-flops are arranged in a different order.

Columns under the label Default Scan Chain Order are results for versions of circuits where scan flip-flops are ordered in the scan chain in the order they appear in the netlist and columns under the label Optimal Scan Chain Order are results for versions of circuits where scan flip-flops are ordered to minimize the number of pairs of adjacent scan flop-flops that drive same fanout cones. Experimental results are shown for circuits whose default scan chain order versions have at least one dependency untestable transition delay fault. Columns # dep. fits show numbers of dependency untestable transition delay faults considered for scan path test point insertion, which remain undetected after all transition delay faults that are detected by the skewed-load and the broadside-load approach under standard scan chain environment are dropped. Columns # dep. FF show numbers of pairs of adjacent scan flip-flops that drive same fanout cones. Columns under headings A, O, AO are results when two-input AND, OR gates and AND-OR complex gates are used as test points, and columns under headings A, O, DFF when two-input AND and OR gates and dummy flip-flops are used as test points. Columns time sec. present CPU times in seconds for the entire process for the proposed technique, which include dependency untestable fault identification, test point vector computation, and test pattern generation and fault simulation using inserted test points, and clustering compatible test point enable signals. Results obtained by using the proposed technique compared with those obtained by a topology-based approach [12] where a dummy flip-flop is inserted into every pair of adjacent flip-flops that have topological correlation. Columns TL % show expected reduction in test application time in percent when same numbers of test patterns are applied by using [12] and the proposed method. Numbers of cluster test enable signals (columns # CE) and numbers of test point enable signals (columns # TP), which include both combinational gates and dummy flip-flops, are reported for both default and optimal scan chain order versions (numbers in shown in parentheses in columns # TP denote numbers of dummy flip-flops). Columns HO % show reduction in area overhead in per cent obtained by the proposed technique over [12]. We calculated area overhead without considering routing overhead under the assumption that sizes of flip-flop and an AND-OR gate are respectively four times and twice larger than that of an AND and the size of an OR gate is the same as that of and AND gate.

100% transition delay fault coverage was achieved for all circuits except s38417 for which the proposed ATPG aborted test generation for 7 faults when backtrack limit of 20,000 was used. This is achieved with small numbers of test points, which are significantly fewer than numbers of pairs of adjacent flip-flops that drive same fanout cones. Ratios of numbers of test points (columns # TP) to numbers of pairs of adjacent flip-flops with topological correlation (columns # dep. FF) are even lower for large benchmark circuits. For all benchmark circuits, numbers of test points inserted for optimal scan chain order versions are smaller than or equal to those of test points inserted for default scan chain order versions. Very few test points are inserted even for large circuits when scan chains are ordered to minimize numbers of pairs of adjacent scan flip-flops that are topologically correlated.

All transition delay faults were detected for optimal scan chain versions of s953 and s1423 in standard scan environment. Hence, no test points were inserted for these circuits. Note that the optimal scan chain version of s1423 has 58 pairs of topologically correlated adjacent flip-flops. However, all transition delay faults were detected without any test point. This demonstrates that if both skewed-load and broadside-load approaches are used, using only topological analysis to break shift dependency between adjacent flip-flops may result in unnecessarily high hardware overhead.

Columns TL % show that scan chain length can be reduced by 14–48% for default order versions of circuits when only combinational gates are used as test points. Even when dummy flip-flops are used as test points, about 40% of reduction in scan chain lengths is obtained for default scan chain order versions of large benchmark circuits. Note that when dummy flip-flops are used as test points as well as combinational gates, the majority of test points inserted are combinational gates, which do not increase scan chain length, for default scan chain order versions of all benchmark circuits. This implies that test application time will not significantly increase even if dummy flip-flops are used as test points. For optimal scan chain order versions of some large circuits such as s38417 and s38584, reduction in scan chain length is not spectacular. However, optimal scan chain ordering is often not practical since it may cost prohibitively high routing overhead. Even for those circuits, the proposed method reduced significant numbers of test points (74 and 58 test point reduction, respectively).

Experimental results demonstrate that area overhead can be drastically reduced by the disclosed technique. Similar or higher reduction is obtained even for optimal scan chain order versions of circuits. Larger reduction in area overhead is obtained for large circuits (for all largest benchmark circuits, higher than 90% reduction in area overhead is achieved when only combinational test points are used). It is notable that for s38417 the proposed technique requires only 1% area overhead of [12].

Cluster test enable signals contribute to routing overhead. While a dummy flip-flop requires only one extra signal (clock signal) to be routed, an AND-OR test point require two test point enable signals to be routed. Hence, it is more desirable to use dummy flip-flops instead of AND-OR complex gates for circuits that are routing congested. On the other hand, if a chip is area limited, or reducing test application time is a primary concern, using AND-OR gates will be a better choice.

This flexibility is one of strong advantages of the proposed techniques among others over prior publications [2, 4, 12]. The reported run times of our programs are comparable to those of regular ATPG and fault simulator. This demonstrates the feasibility of the proposed technique. Run times of our program for both default and optimal scan chain order versions are similar.

In this disclosure, only the transition delay model is discussed. However, the proposed method can be extended to improve fault coverage for other fault models that require two pattern testing such as path delay and stuck-open fault models. The framework of the proposed method can also be used in random pattern testing as well as deterministic testing. In random pattern testing, cluster test point enable signals should be driven by a random pattern generator.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A logic circuit comprising at least one input, one output and a delay fault circuit, said delay fault circuit including:
   a first standard scan cell;
   a combinational test point positioned immediately after the first standard scan cell in a scan chain; and
   a second standard scan cell positioned immediately after the combinational test point in the scan chain.

2. The logic circuit of claim 1, where the combinational test point is positioned to prevent shift dependency between the first standard scan cell and the second standard scan cell.

3. The logic circuit of claim 1, where the first and second standard scan cells are flip-flops.

4. The logic circuit of claim 1, where the combinational test point comprises an AND gate.

5. The logic circuit of claim 1, where the combinational test point comprises an OR gate.

6. The logic circuit of claim 1, where the combinational test point comprises an AND-OR gate.

7. The logic circuit of claim 1, where the logic circuit is testable under a full standard scan environment.

8. The logic circuit of claim 1, where the logic circuit is testable under a partial standard scan environment.

9. The logic circuit of claim 1, where the logic circuit includes at least one enhanced scan cell.

10. The logic circuit of claim 1, where the circuit is structured so that at least one stuck-at fault in the circuit can be tested.

11. The logic circuit of claim 1, where the circuit is structured so that at least one delay fault in the circuit can be tested.

12. A logic circuit comprising at least one input, one output and a delay fault circuit, said delay fault circuit including:
   a first standard scan cell; a test point positioned immediately after the first standard scan cell in a scan chain; and
   a second standard cell positioned immediately after the test point in the scan chain,
   where the test point is positioned to prevent shift dependency identified to occur between the first and second standard scan cells in the delay fault circuit.

13. The logic circuit of claim 12, where the position of the test point is determined based on a functional analysis of the circuit.

14. The logic circuit of claim 12, wherein the test point is a dummy scan flip-flop in a scan chain that does not provide input to any primary inputs in the logic circuit.

15. The logic circuit of claim 12, wherein the test point is a combinational test point.

16. The logic circuit of claim 12, wherein the position of the test point is determined by:
   identifying dependency untestable transition delay faults;
   for every such fault,
      generating a test cube pair for the fault if the fault has a minimum test generation cost, and
      if there is no conflict with any other test cube pair in a current test cube pair set, adding the test cube pair into the current test cube pair set and updating a current test point vector based on the current test cube pair set; and
   generating a global test point vector based on the current test point vector, where the global test point vector specifies the position where the test point should be inserted.

17. The logic circuit of claim 16, where the global test vector also specifies what type of test point should be inserted.

18. A method of testing a logic circuit comprising:
   loading a first test pattern into a first standard scan cell in a scan chain;
   loading an output of the first standard cell into a combinational test point in the scan chain; and
   loading an output of the combinational test point into a second standard scan cell in the scan chain.

19. The method of testing a logic circuit as in claim 18, where the combinational test point prevents shift dependency between the first standard scan cell and the second standard scan cell.

20. The method of claim 18, where the logic circuit is testable under a full standard scan environment.

21. The method of claim 18, where the logic circuit is testable under a partial standard scan environment.

22. The method of claim 18, where the logic circuit includes at least one enhanced scan cell.

23. The method of claim 18, where at least one stuck-at fault in the logic circuit is tested.

24. The method of claim 18, where at least one delay fault in the logic circuit is tested.

25. The method of claim 18, where the combinational test point comprises an AND gate.

26. The method of claim 18, where the combinational test point comprises an OR gate.

27. The method of claim 18, where the combinational test point comprises an AND-OR gate.

28. An integrated circuit comprising at least one logic circuit and at least one delay fault circuit, the delay fault circuit including:
   a first standard scan cell in a scan chain;
   a combinational test point positioned immediately after the first standard scan cell in the scan chain; and
   a second standard scan cell positioned immediately after the combinational test point in the scan chain.

29. The integrated circuit of claim 28, where the first and second scan cells are flip-flops.

30. The integrated circuit of claim 28, where the combinational test point is positioned to prevent shift dependency between the first standard scan cell and the second standard scan cell.

31. The integrated circuit of claim 28, where the combinational test point further comprises an AND gate, an OR gate, or an AND-OR gate.

32. A method for designing a circuit that is testable using a scan-based technique comprising:
   accurately identifying, based on a functional analysis of the circuit, at least one pair of standard scan cells in the circuit where shift dependency occurs; and
   inserting a test point at the identified point in the circuit.

33. The method of claim 32, where the inserted test points are dummy scan memories.

34. The method of claim 33, where the scan memories are flip-flops.

35. The method of claim 32, where the inserted test points are combinational gates.

36. The method of claim 32, where the points in the circuit where shift dependency occurs are identified using an automatic test program generator (ATPG).

37. The method of claim 36, where the ATPG identifies scan memories between which the test points are inserted.

38. The method of claim 37, where the scan memories are flip-flops.

* * * * *